US012599049B2

(12) United States Patent
Yamada et al.

(10) Patent No.: US 12,599,049 B2
(45) Date of Patent: *Apr. 7, 2026

(54) LIGHT-EMITTING DEVICE, INTEGRATED LIGHT-EMITTING DEVICE, AND LIGHT-EMITTING MODULE

(71) Applicant: NICHIA CORPORATION, Anan (JP)

(72) Inventors: Motokazu Yamada, Tokushima (JP); Yuichi Yamada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/650,941

(22) Filed: Apr. 30, 2024

(65) Prior Publication Data

US 2024/0282758 A1 Aug. 22, 2024

Related U.S. Application Data

(63) Continuation of application No. 17/974,666, filed on Oct. 27, 2022, now Pat. No. 11,978,725, which is a
(Continued)

(30) Foreign Application Priority Data

Oct. 8, 2015 (JP) ................................. 2015-200445
Oct. 6, 2016 (JP) ................................. 2016-197968

(51) Int. Cl.
*H01L 25/075* (2006.01)
*F21V 7/00* (2006.01)
(Continued)

(52) U.S. Cl.
CPC ............ *H01L 25/0753* (2013.01); *F21V 7/00* (2013.01); *F21V 9/08* (2013.01); *F21V 23/002* (2013.01);
(Continued)

(58) Field of Classification Search
CPC ... H01L 25/0753; H01L 33/46; H01L 33/505; H01L 33/54; H01L 33/58; H01L 33/60;
(Continued)

(56) References Cited

U.S. PATENT DOCUMENTS 6,155,699 A    12/2000  Miller et al.
6,345,903 B1 *  2/2002  Koike ................ H10H 20/8506
                                                        257/E33.059
(Continued)

FOREIGN PATENT DOCUMENTS

CN         103400921 A     11/2013
CN         103872223 A      6/2014
(Continued)

OTHER PUBLICATIONS

Extended European Search Report dated Jan. 20, 2017 in corresponding European Patent Application No. 16192778.5.
(Continued)

*Primary Examiner* — Bao Q Truong
(74) *Attorney, Agent, or Firm* — Foley & Lardner LLP

(57) ABSTRACT

A integrated light-emitting device includes: a base including a conductive wiring; a plurality of light-emitting devices mounted on the base and configured to emit a first light, each of the light-emitting devices comprising a light-emitting element and a encapsulant covering the light-emitting element; a light reflective film provided on an upper surface of the light-emitting element; and a plurality of light reflective members disposed between adjacent ones of the light-emitting devices. A ratio (H/W) of a height (H) of the encapsulant to a width (W) of a bottom surface of the encapsulant is less than 0.5. Each of the light-emitting devices has a batwing light distribution characteristics.

16 Claims, 10 Drawing Sheets

Related U.S. Application Data continuation of application No. 17/382,699, filed on Jul. 22, 2021, now Pat. No. 11,515,296, which is a continuation of application No. 15/288,501, filed on Oct. 7, 2016, now Pat. No. 11,101,247.

(51) Int. Cl.

| | |
|---|---|
| *F21V 9/08* | (2018.01) |
| *F21V 23/00* | (2015.01) |
| *G02F 1/13357* | (2006.01) |
| *H10H 20/841* | (2025.01) |
| *H10H 20/851* | (2025.01) |
| *H10H 20/853* | (2025.01) |
| *H10H 20/855* | (2025.01) |
| *H10H 20/856* | (2025.01) |
| *H10H 20/857* | (2025.01) |
| *F21Y 115/10* | (2016.01) |
| *G02F 1/1335* | (2006.01) |
| *H10H 20/854* | (2025.01) |

(52) U.S. Cl.
CPC ..... *G02F 1/133605* (2013.01); *H10H 20/841* (2025.01); *H10H 20/8514* (2025.01); *H10H 20/853* (2025.01); *H10H 20/855* (2025.01); *H10H 20/856* (2025.01); *H10H 20/857* (2025.01); *F21Y 2115/10* (2016.08); *G02F 1/133603* (2013.01); *G02F 1/133614* (2021.01); *H01L 2224/16225* (2013.01); *H01L 2924/181* (2013.01); *H10H 20/8515* (2025.01); *H10H 20/854* (2025.01)

(58) Field of Classification Search
CPC ....... H01L 33/62; H01L 33/507; H01L 33/56; H01L 2224/16225; H01L 2924/181; F21V 7/00; F21V 9/08; F21V 23/002; G02F 1/133605; G02F 1/133614; G02F 1/133603; F21Y 2115/10
See application file for complete search history.

(56) References Cited

U.S. PATENT DOCUMENTS

| | | | | |
|---|---|---|---|---|
| 7,222,993 | B2 | 5/2007 | Kikuchi et al. | |
| 9,200,763 | B2 | 12/2015 | Schnobrich et al. | |
| 11,101,247 | B2 | 8/2021 | Yamada et al. | |
| 11,515,296 | B2 * | 11/2022 | Yamada | H01L 33/54 |
| 11,978,725 | B2 * | 5/2024 | Yamada | H01L 33/60 |
| 2006/0208268 | A1 | 9/2006 | Ueno et al. | |
| 2007/0138494 | A1 | 6/2007 | Pugh et al. | |
| 2007/0284600 | A1 | 12/2007 | Shchekin et al. | |
| 2008/0315228 | A1 | 12/2008 | Krames et al. | |
| 2010/0073597 | A1 | 3/2010 | Bierhuizen et al. | |
| 2011/0164308 | A1 | 7/2011 | Arsenault et al. | |
| 2012/0113621 | A1 | 5/2012 | Lee et al. | |
| 2013/0058102 | A1 | 3/2013 | Lin | |
| 2013/0070165 | A1 | 3/2013 | Shimizu | |
| 2014/0146518 | A1 * | 5/2014 | Chen | G02F 1/133603 362/84 |

| | | | | |
|---|---|---|---|---|
| 2014/0160766 | A1 * | 6/2014 | Chinniah | G02B 19/0028 362/308 |
| 2014/0191258 | A1 | 7/2014 | Akimoto et al. | |
| 2015/0001564 | A1 | 1/2015 | Oguro et al. | |
| 2015/0069434 | A1 | 3/2015 | Lin | |
| 2015/0129902 | A1 * | 5/2015 | Iino | H10H 20/841 257/98 |
| 2015/0155447 | A1 | 6/2015 | Beppu | |
| 2015/0226400 | A1 * | 8/2015 | Wada | H10H 20/856 362/97.1 |
| 2016/0268481 | A1 | 9/2016 | Beppu | |
| 2016/0320001 | A1 | 11/2016 | Soer et al. | |

FOREIGN PATENT DOCUMENTS

| | | | |
|---|---|---|---|
| JP | 2001-257381 A | 9/2001 | |
| JP | 2004-207519 A | 7/2004 | |
| JP | 2006-261540 A | 9/2006 | |
| JP | 2007-173849 A | 7/2007 | |
| JP | 2008-004948 A | 1/2008 | |
| JP | 2008-041290 A | 2/2008 | |
| JP | 2010-092672 A | 4/2010 | |
| JP | 2012-503782 A | 2/2012 | |
| JP | 2012-059988 A | 3/2012 | |
| JP | 2014-187095 A | 2/2014 | |
| JP | 2014-524674 A | 9/2014 | |
| JP | 2015-012206 A | 1/2015 | |
| JP | 2015-022989 A | 2/2015 | |
| JP | 2015-095488 A | 5/2015 | |
| JP | 2015-106666 A | 6/2015 | |
| KR | 20150048578 A | 5/2015 | |
| TW | 201413347 A | 4/2014 | |
| WO | WO-02/41406 A1 | 5/2002 | |
| WO | WO-2004/102632 A2 | 11/2004 | |
| WO | WO-2011/158555 A1 | 12/2011 | |
| WO | WO-2015/092696 A | 6/2015 | |
| WO | WO-2016/006781 A1 | 1/2016 | |

OTHER PUBLICATIONS

Final Office Action in U.S. Appl. No. 15/288,501 dated Apr. 17, 2019.
Final Office Action in U.S. Appl. No. 15/288,501 dated May 19, 2020.
Non-Final Office Action in U.S. Appl. No. 15/288,501 dated Feb. 19, 2019.
Non-Final Office Action in U.S. Appl. No. 15/288,501 dated Jun. 28, 2018.
Non-Final Office Action in U.S. Appl. No. 15/288,501 dated Sep. 18, 2020.
Non-Final Office Action in U.S. Appl. No. 17/382,699 dated Apr. 12, 2022.
Non-Final Office Action in U.S. Appl. No. 17/974,666 dated Aug. 29, 2023.
Notice of Allowance in U.S. Appl. No. 15/288,501 dated Apr. 26, 2021.
Notice of Allowance in U.S. Appl. No. 17/382,699 dated Jul. 28, 2022.
Notice of Allowance in U.S. Appl. No. 17/974,666 dated Jan. 11, 2024.

* cited by examiner

Light distribution angle [deg]

Light distribution angle [deg]

LIGHT-EMITTING DEVICE, INTEGRATED LIGHT-EMITTING DEVICE, AND LIGHT-EMITTING MODULE

CROSS-REFERENCE TO RELATED APPLICATIONS

The present application is a continuation of U.S. patent application Ser. No. 17/974,666, filed on Oct. 27, 2022, which is a continuation of U.S. patent application Ser. No. 17/382,699, filed on Jul. 22, 2021 (now U.S. Pat. No. 11,515,296), which is a continuation of U.S. patent application Ser. No. 15/288,501, filed on Oct. 7, 2016 (now U.S. Pat. No. 11,101,247), which claims priority to Japanese Patent Application No. 2015-200445, filed on Oct. 8, 2015, and Japanese Patent Application No. 2016-197968, filed on Oct. 6, 2016. The disclosures of these applications are hereby incorporated by reference in their entireties.

BACKGROUND

The present disclosure relates to light-emitting devices, integrated light-emitting devices, and light-emitting modules.

In recent years, various electronic components have been proposed and put into practical use, and they are required to exhibit higher performance. In particular, some electronic components need to maintain their performance for a long period of time under a harsh usage environment. Such requirements can apply to light-emitting devices using semiconductor light-emitting elements, including a light-emitting diode (i.e., LED). That is, in the fields of general illumination and interior and exterior lighting for vehicles, the light-emitting devices have been increasingly required day by day to demonstrate higher performance, specifically, higher output (i.e., higher luminance) and higher reliability. Furthermore, the light-emitting devices are requested to be supplied at low costs while maintaining high performance.

Backlights used in liquid crystal televisions, general lighting devices, and the like are developed by focusing on their designs, which leads to a high demand for thinning.

For example, Japanese Unexamined Patent Application Publication No. 2008-4948 discloses a light-emitting device in which a reflector is provided on the upper surface of a light-emitting element mounted on a submount in a flip-chip manner to thereby achieve thinning of the backlight. [

Japanese Unexamined Patent Application Publication No. 2008-4948 can achieve the light-emitting device with wide light distribution. However, with further thinning of the backlight, a light-emitting device capable of achieving much wider light distribution has been required.

SUMMARY

Embodiments of the present disclosure have been made in view of the foregoing circumstances, and it is an object of the embodiments of the present disclosure to provide a light-emitting device that enables wide light distribution without using a secondary lens.

A light-emitting device according to an embodiment includes: a base including a conductive wiring; a light-emitting element mounted on the base and adapted to emit light; a light reflective film provided on an upper surface of the light-emitting element; and a encapsulant covering the light-emitting element and the light reflective film, in which a ratio (H/W) of a height (H) of the encapsulant to a width (W) a bottom surface of of the encapsulant is less than 0.5.

Accordingly, the embodiment of the present disclosure enables the wide light distribution without using a secondary lens.

DETAILED DESCRIPTION

Figure 1:
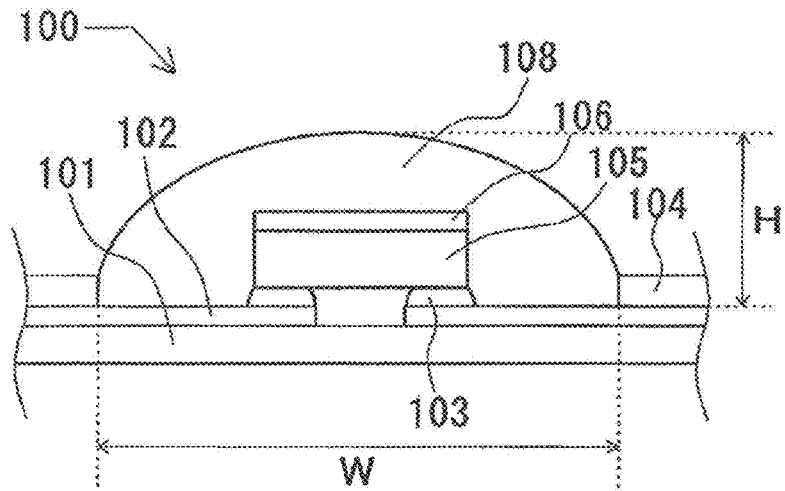
FIG. 1 is a cross-sectional view showing an example of a light-emitting device according to a first embodiment.

Embodiments of the present disclosure will be described below with reference to the accompanying drawings as appropriate. A light-emitting device to be described below is to embody the technical idea of the present disclosure and is not intended to limit the present invention unless otherwise specified. The contents of the description regarding one embodiment or example can also be applied to other embodiments and examples.

Furthermore, in the description below, the same names or reference characters denote the same or similar members, and thus a detailed description thereof will be omitted as appropriate. Moreover, regarding each element configuring the present invention, a plurality of elements may be formed by the same member, thereby allowing this one member to function as these elements. Conversely, the function of one member can be shared and achieved by a plurality of members.

First Embodiment

FIG. 1 is a schematic configuration diagram showing one example of a light-emitting device according to a first embodiment.

As shown in FIG. 1, in this embodiment, the light-emitting device includes a base 101 with conductive wirings 102, and a light-emitting element 105 mounted on the base 101. The light-emitting element 105 is mounted in a flip-chip manner via bonding members 103 to straddle at least a region between a pair of conductive wirings 102 provided at the surface of the base 101. A light reflective film 106 is formed on a light extraction surface side of the light-emitting element 105 (i.e., upper surface of the light-emitting element 105). At least a part of each conductive wiring may be provided with an insulating member 104. A region of the upper surface of the conductive wiring 102 electrically connected to the light-emitting element 105 is exposed from the insulating member 104.

Figure 2:
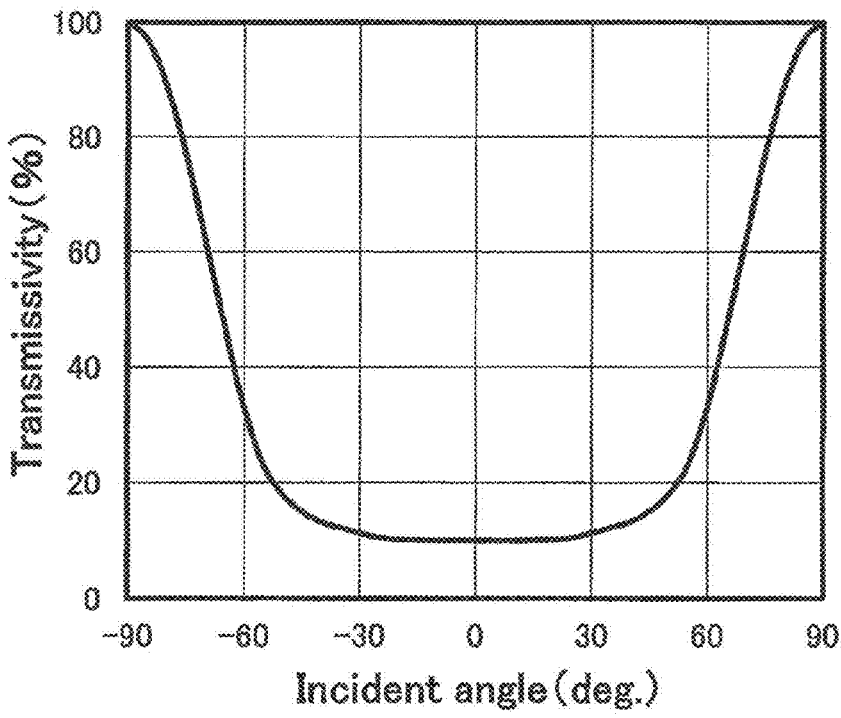
FIG. 2 is a diagram showing incident-angle dependence of a light transmissivity of a light reflective film in the embodiment.

The light transmissivity of the light reflective film 106 is dependent on an angle of incidence of the light incident from the light-emitting element 105. FIG. 2 is a diagram showing incident-angle dependence of the light transmissivity of the light reflective film 106 in this embodiment. The light reflective film 106 hardly allows the light to pass therethrough in the direction perpendicular to the upper surface of the light-emitting element 105, but increases the amount of the light transmitted as the angle of incidence increases relative to the perpendicular direction. Specifically, when the incident angle is in a range of −30° to 30°, the light transmissivity is approximately 10%. When the incident angle becomes smaller than −30°, the light transmissivity gradually becomes larger. Further, when the incident angle becomes smaller than −50°, the light transmissivity increases drastically. Likewise, when the incident angle becomes larger than 30°, the light transmissivity gradually becomes larger. Further, when the incident angle becomes larger than 50°, the light transmissivity increases drastically. That is, the light transmissivity of the light reflective film for said light increases as an absolute value of an incident angle increases. The formation of such a reflective film can achieve the batwing light distribution characteristics shown in FIG. 4.

The term "batwing light distribution characteristics" as used herein means the light distribution characteristics exhibiting a first peak in a first region with a light distribution angle of less than 90°, the first peak having a higher intensity than that at the light distribution angle of 90°, as well as a second peak in a second region with a light distribution angle of more than 90°, the second peak having a higher intensity than that at the light distribution angle of 90°.

The light-emitting element 105 is covered with a light transmissive encapsulant 108. The encapsulant 108 is disposed on the base to cover the light-emitting element 105 in order to protect the light-emitting element 105 from an external environment and to optically control the light output from the light-emitting element. The encapsulant 108 is formed substantially in the dome shape. The encapsulant 108 covers the light-emitting element 105 with the light reflective film 106 disposed thereto, the surfaces of the conductive wirings 102 located around the light-emitting element 105, and connection portions between the light-emitting element 105 including the bonding members 103 and the conductive wirings 102. That is, the upper surface and lateral surfaces of the light reflective film 106 are in contact with the encapsulant 108, and the lateral surfaces of the light-emitting element 105 not covered with the light reflective film 106 are also in contact with the encapsulant 108. The connection portions may be covered with an underfill, not with the encapsulant 108. In this case, the encapsulant 108 is formed to cover the upper surface of the underfill and the light-emitting element. In this embodiment, the light-emitting element 105 is directly covered with the encapsulant 108.

The encapsulant 108 is preferably formed to have a circular or ellipsoidal outer shape in the top view, with the ratio of a height (H) of the encapsulant in an optical-axis direction to a diameter (width: W) of the encapsulant in the top view set to a value less than 0.5. For the encapsulant 108 having the ellipsoidal shape, there are a major axis and a minor axis that can be considered as the length of the width, but the minor axis is defined as a diameter (W) of the encapsulant 108 in the present specification. The upper surface of the encapsulant 108 is formed in a convex curved shape.

With this arrangement, the light emitted from the light-emitting element 105 is refracted at an interface between the encapsulant 108 and air, which can achieve the wider light distribution.

Here, the height (H) of the encapsulant indicates the height from a mounting surface for the light-emitting element 105 as shown in FIG. 1. The width (W) of the encapsulant indicates its diameter when the encapsulant has a circular bottom surface as mentioned above, or alternatively indicates the length of the shortest part thereof when the encapsulant has any shape other than the circle.

Figure 4:
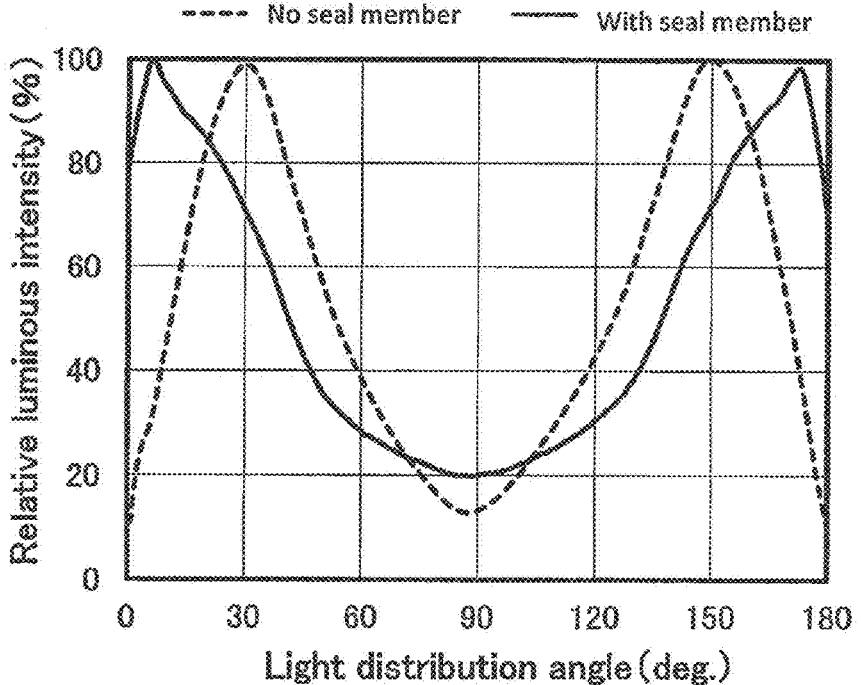
FIG. 4 is a light distribution characteristic diagram of the light-emitting device in the embodiment.

FIG. 4 shows an example of changes in the light distribution characteristics depending on the presence or absence of the encapsulant 108. In FIG. 4, the solid line shows the light distribution characteristic of a light-emitting device 100 in the first embodiment. On the other hand, the dotted line shows the light distribution characteristic of a light-emitting device fabricated in the same way as in the first embodiment except that the encapsulant 108 is not formed.

As can be seen from FIG. 4 according to the light-emitting device in the first embodiment, the first peak moves in the direction that decreases the light distribution angle as well as the second peak moving in the direction that increases the light distribution angle, as compared with a light-emitting device without the encapsulant 108.

Therefore, the light-emitting device in the first embodiment can achieve the wider light distribution.

The use of both the light reflective film 106 and the encapsulant 108 in this way can achieve the desired light distribution characteristics without using the secondary lens. That is, the formation of the light reflective film 106 can reduce the luminance directly above the light-emitting element 105, while the encapsulant 108 can concentrate on widening the distribution of the light from the light-emitting element 105, which enables significant downsizing of the encapsulant with a lens function.

In other words, conventionally, reduction in luminance directly above the light-emitting element while widening the light distribution is possible only by adjusting a height of the encapsulant, as a result, the height of the encapsulant must be increased In contrast, the light-emitting device in this embodiment includes the light reflective film 106 having reduced luminance directly above the light-emitting element 105, thereby achieving the batwing light distribution characteristics. Thereby, the encapsulant 108 can be configured to focus on the function of widening the light distribution. Thus, this embodiment can achieve downsizing of the light-emitting device.

Figure 5:
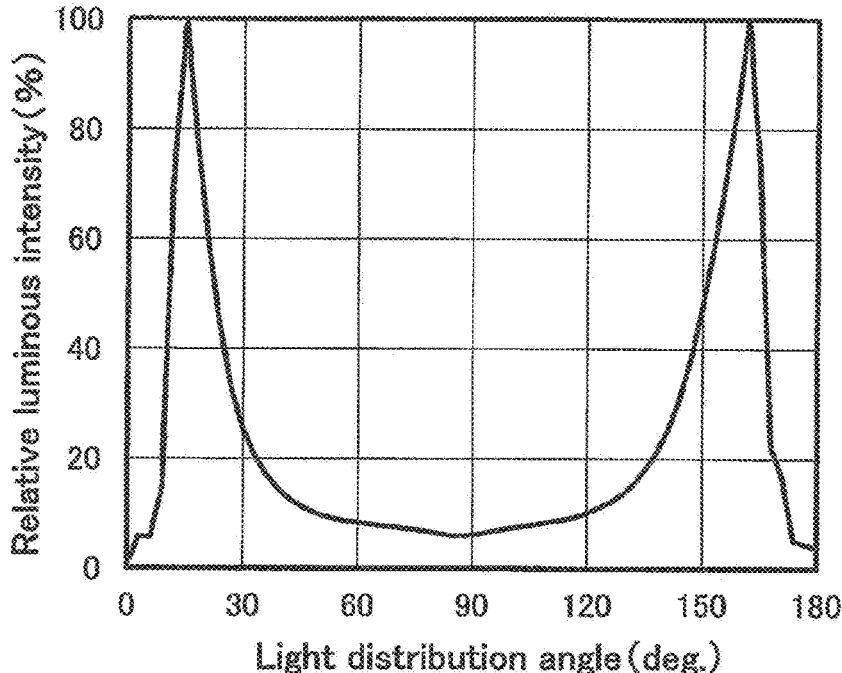
FIG. 5 is a light distribution characteristic diagram of a light-emitting device using a secondary lens in Comparative Example.

This arrangement can achieve a thinned backlight module (i.e., light-emitting module) with which non-uniform luminance is reduced, as will be mentioned later. FIG. 5 shows the light distribution characteristics obtained by using the secondary lens as a comparative example. Even without using any secondary lens, the light-emitting device in this embodiment can achieve substantially the same light distribution characteristics as when using a secondary lens.

Nine light-emitting devices with different heights (H) in the optical axis direction of the encapsulants 108 and different diameters (widths: W) of the encapsulants in the top view were fabricated. The results of their light distribution characteristics are shown in FIGS. 6A-6I. The light-emitting element used therein was a blue LED having a substantially square shape with one side of 600 μm in length in the planar view and a thickness of 150 μm. The light reflective film 106 formed on the main surface of the light-emitting element 105 is configured of eleven layers by repeatedly forming a $SiO_2$ layer (82 nm in thickness) and a $Zro_2$ layer (54 nm in thickness).

Regarding each of the nine light-emitting devices No. 1 to No. 9, the ratio of the height (H) of the encapsulant to the diameter (width: W) of the encapsulant is shown in Table 1.

TABLE 1

Figure 6A:
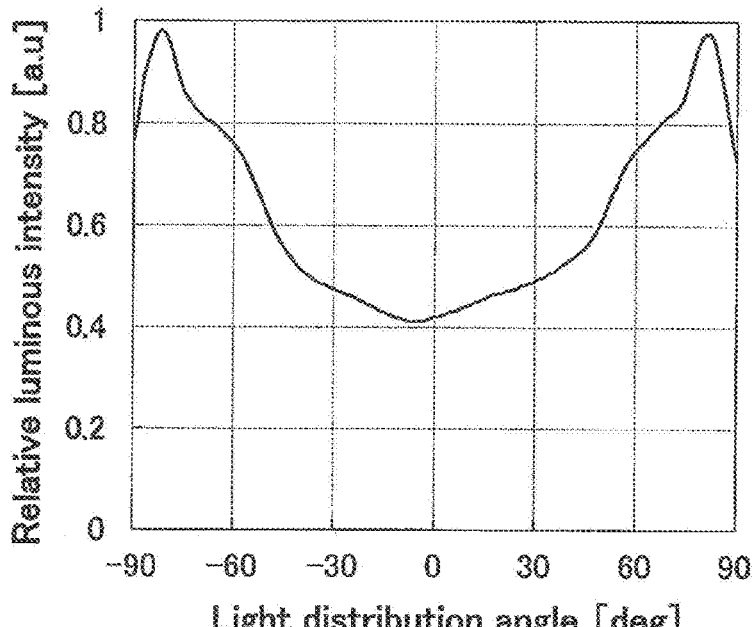
FIGS. 6A-6I show Experimental Examples according to the embodiment.
Figure 6B:
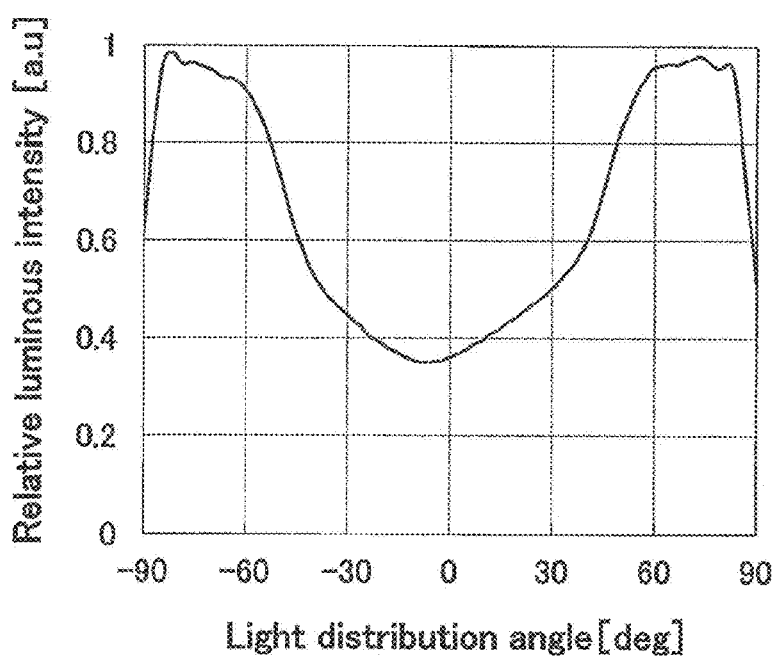
Figure 6C:
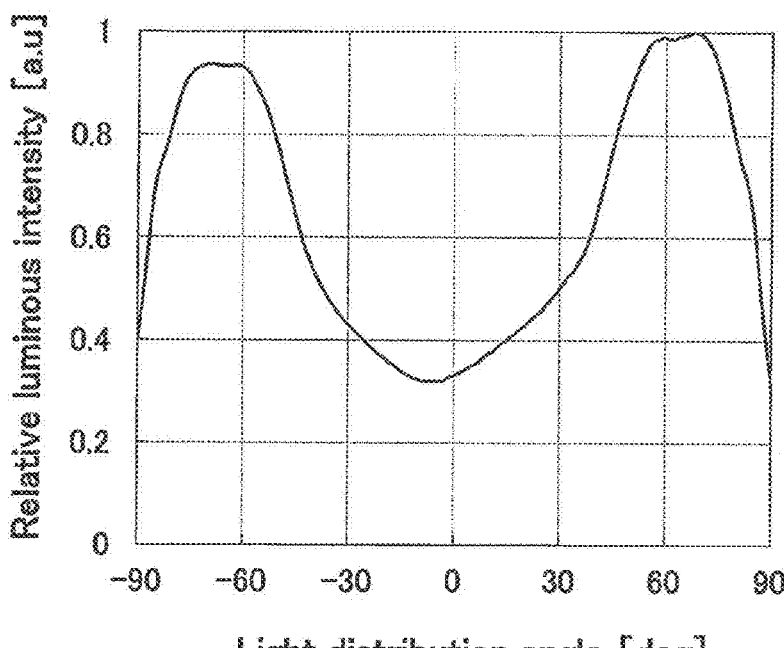
Figure 6D:
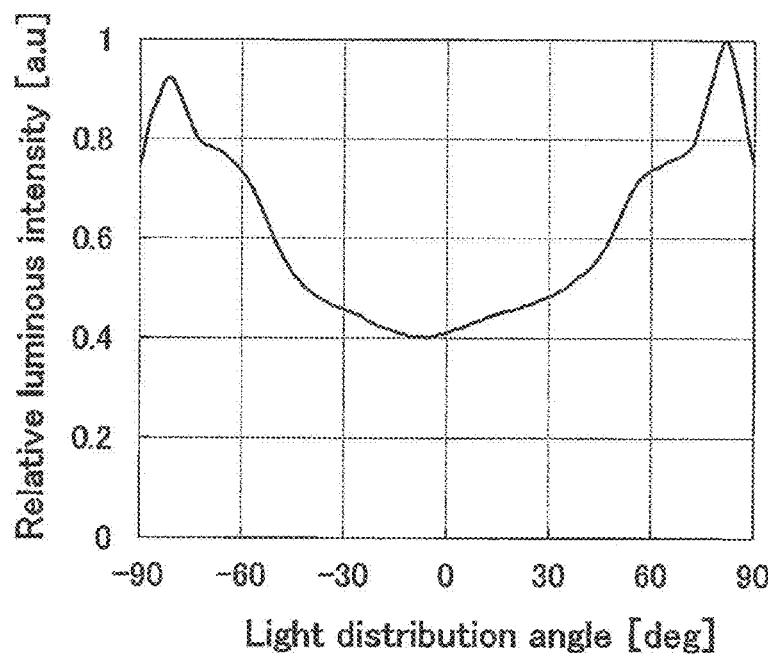
Figure 6E:
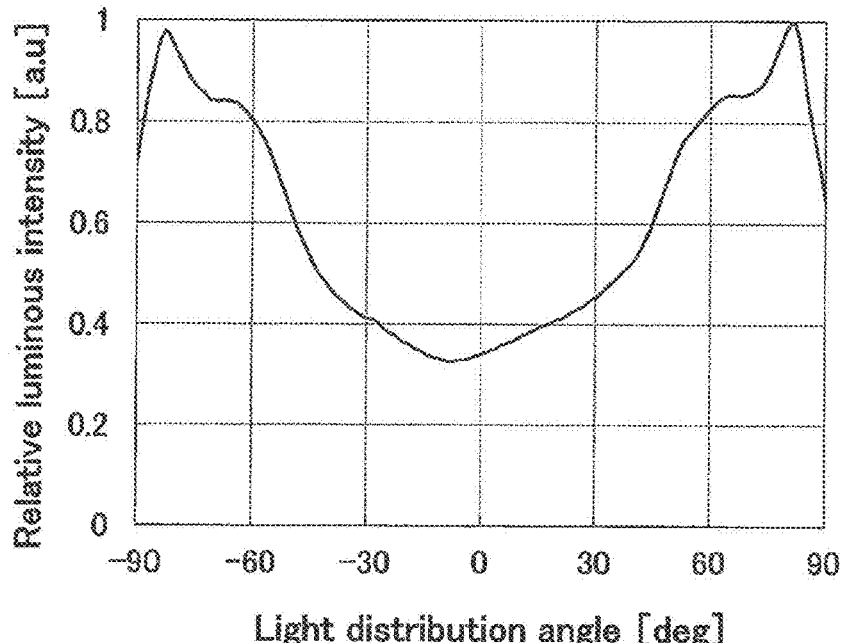
Figure 6F:
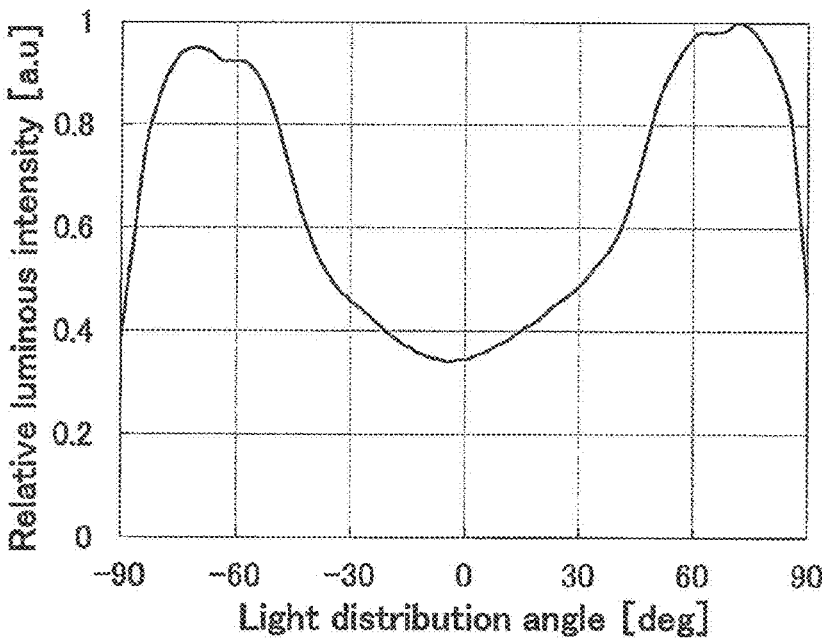
Figure 6G:
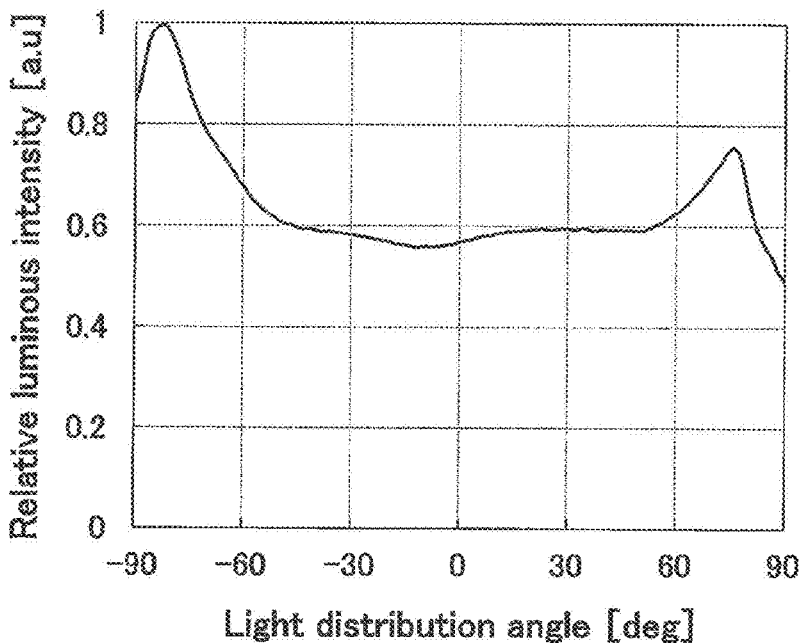
Figure 6H:
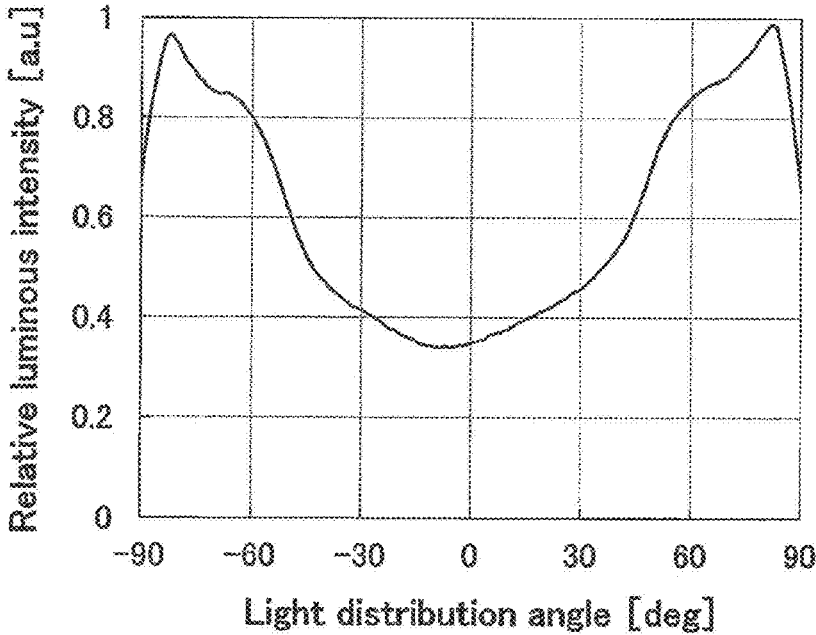
Figure 6I:
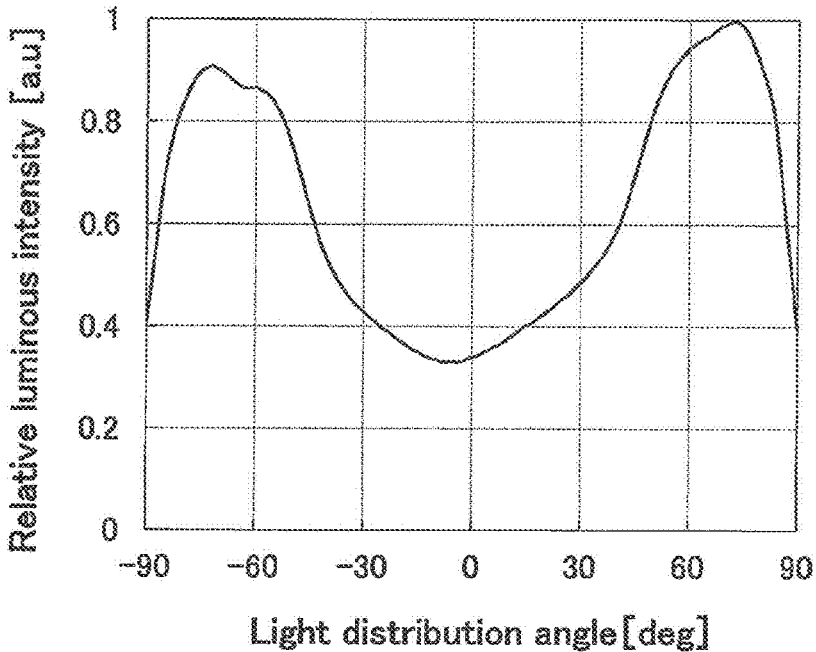

|  | No. 1 | No. 2 | No. 3 | No. 4 | No. 5 | No. 6 | No. 7 | No. 8 | No. 9 |
|---|---|---|---|---|---|---|---|---|---|
| H(mm) | 0.70 | 0.89 | 0.92 | 0.79 | 0.93 | 1.09 | 0.74 | 1.00 | 1.18 |
| W(mm) | 2.76 | 2.78 | 2.56 | 3.06 | 3.14 | 3.11 | 3.40 | 3.28 | 3.29 |
| H/W | 0.25 | 0.32 | 0.36 | 0.26 | 0.30 | 0.35 | 0.22 | 0.30 | 0.36 |
| Result | FIG. 6A | FIG. 6B | FIG. 6C | FIG. 6D | FIG. 6E | FIG. 6F | FIG. 6G | FIG. 6H | FIG. 6I |

As can be seen from the experimental results, the light distribution characteristics did not change so much due to the difference in the diameter of the encapsulant. However, the ratio of the height (H) of the encapsulant to the diameter (width: W) of the encapsulant affected the light distribution characteristics.

The graphs of FIGS. 6A-6I show that the ratio (H/W) of the height (H) to the width (W) of the encapsulant is preferably 0.3 or less in order to achieve a wider light distribution.

Preferred examples of the light-emitting device 100 in this embodiment will be described below.

(Base 101)

The base 101 is a member for mounting the light-emitting element 105. The base 101 has the conductive wirings 102 on its surface to supply electric power to the light-emitting element 105.

Examples of a material for the base 101 can include ceramics, and resins such as a phenol resin, an epoxy resin, a polyimide resin, a BT resin, polyphthalamide (PPA), and polyethylene terephthalate (PET). Among them, the resin is preferably selected as the material in terms of low cost and formability. The thickness of the base can be selected as appropriate. The base may be either a rigid base or a flexible base manufacturable by a roll-to-roll system. The rigid base may be a thinned rigid base that is bendable.

To obtain the light-emitting device with high resistance to heat and light, ceramics are preferably selected as the material for the base 101. Examples of ceramics can include alumina, mullite, forsterite, glass-ceramics, nitride-based (e.g., AlN) ceramics, and carbide-based (e.g., siC) ceramics. Among them, ceramics made of alumina or mainly containing alumina are preferable.

In the use of a resin as the material for the base 101, an inorganic filler such as glass fiber, $SiO_2$, $TiO_2$, or $Al_2O_3$, is mixed into the resin, thereby allowing the base to have improved mechanical strength and improved optical reflectance, reduced thermal expansion rate, and the like. The base 101 may be any other member as long as it can separate and insulate a pair of conductive wirings 102 from each other. The base 101 may employ a so-called metal base that includes a metal member with an insulating layer formed therein.

(Conductive Wiring 102)

The conductive wirings 102 are members electrically connected to electrodes of the light-emitting element 105 and adapted to supply current (electric power) from the outside to the light-emitting element. That is, the conductive wiring serves as an electrode or a part thereof for energization with the power from the outside. Normally, the conductive wirings are formed of at least two wirings, namely, positive and negative wirings spaced apart from each other.

Each conductive wiring 102 is formed over at least an upper surface of the base that serves as a mounting surface for the light-emitting element 105. Material for the conductive wiring 102 can be selected as appropriate, depending on material used for the base 101, a manufacturing method thereof, and the like. For example, when ceramic is used as the material for the base 101, the conductive wirings 102 are preferably made of material having a high melting point that can withstand the sintering temperature of a ceramic sheet. Specifically, metal with a high melting point, such as tungsten or molybdenum, is preferably used as the material for the conductive wiring. Further, other metal materials, such as nickel, gold, or silver may be formed to cover the above-mentioned surface of the conductive wiring by plating, sputtering, vapor deposition, etc.

When the glass epoxy resin is used as the material for the base 101, the material for the conductive wiring 102 is preferably made of material that is easy to process. In the case of using the epoxy resin injection-molded, the conductive wiring 102 is made of material that can be easily processed by punching, etching, bending, etc., and has a relatively high mechanical strength. Specifically, examples of the conductive wiring can include metals, such as copper, aluminum, gold, silver, tungsten, iron, and nickel, and a metal layer or lead frame made of an iron-nickel alloy, phosphor bronze, an iron-copper alloy, molybdenum, and the like. The surface of the lead frame may be coated with a metal material other than that of a lead frame main body. Such metal materials can be appropriately selected, for example, silver alone, or an alloy of silver and copper, gold, aluminum or rhodium. Alternatively, the conductive wiring can be formed of multiple layers using silver or each alloy. Suitable methods for coating with a metal material can include sputtering, vapor deposition, and the like as well as the plating.

(Bonding Member 103)

The bonding members 103 are members for fixing the light-emitting element 105 onto the base 101 or conductive wirings 102. In the flip-chip mounting, conductive members are used as the bonding members in the same manner as in this embodiment. Specifically, suitable materials for the bonding member can include an Au-containing alloy, an Ag—containing alloy, a Pd-containing alloy, an In—containing alloy, a Pb—Pd containing alloy, an Au—Ga containing alloy, an Au—Sn containing alloy, an Sn-containing alloy, an Sn—Cu containing alloy, an Sn—Cu—Ag containing alloy, an Au—Ge containing alloy, an Au—Si containing alloy, an Al—containing alloy, a Cu—In containing alloy, and a mixture of metal and a flux.

Suitable forms of the bonding member 103 can include a liquid-type, a paste-type, and/or a solid-type (e.g., sheet-shaped, block-shaped, wire-shaped and/or powder-form). The form of the bonding member can be selected based on the composition thereof, the shape of the base, and the like, as appropriate. These bonding members 103 may be formed of a single member or a combination of several kinds of members.

(Insulating Member 104)

The conductive wirings 102 are preferably covered with the insulating member 104 except for parts thereof electrically connected to the light-emitting element 105 and other materials. That is, as shown in the respective figures, a resist for insulating and covering the conductive wirings 102 may be disposed over the base. The insulating member 104 can function as such a resist.

In the case of disposing the insulating member 104, a white-based filler can be contained in the insulating member. The white-based filler contained in the insulating member can reduce leakage and absorption of light, thereby enabling improvement of the light extraction efficiency of the light-emitting device 100 as well as insulating the conductive wirings 102.

Material for the insulating member 104 can be appropriately selected on the basis that the material is less likely to absorb the light from the light-emitting-element and have an insulating property. Examples of the material for the insulating member can include epoxy, silicone, modified silicone, urethane, oxetane, acrylic, polycarbonate, and polyimide resins.

(Light-Emitting Element 105)

The light-emitting element 105 mounted on the base can be one known in the art. In this embodiment, a light-emitting diode is preferably used as the light-emitting element 105.

A light-emitting element 105 that emits light at an appropriate wavelength can be selected. For example, a blue or green light-emitting element can utilize ZnSe, a nitride-based semiconductor ($In_xAl_yGa_{1-x-y}N$, $0 \leq X$, $0 \leq Y$, $X+Y \leq 1$), or GaP. A light transmissive sapphire substrate and the like can be used as a growth substrate. A red light-emitting element can use GaAlAs, AlInGaP, etc. Moreover, semiconductor light-emitting elements made of any material other than the materials mentioned above can also be used. The composition, emission color, and size of the light-emitting element for use, and the number of light-emitting elements for use, and the like can be selected as appropriate in accordance with the purpose.

Various emission wavelengths can be selected depending on the material of the semiconductor layer and a mixed crystal ratio thereof. The light-emitting element may have positive and negative electrodes on the same surface side to enable the flip-chip mounting, or may alternatively have positive and negative electrodes on its different surfaces.

The light-emitting element 105 in this embodiment has a light transmissive substrate, and a semiconductor layer stacked on the substrate. The semiconductor layer includes an n-type semiconductor layer, an active layer, and a p-type semiconductor layer formed in this order. An n-type electrode is formed on the n-type semiconductor layer, and a p-type electrode is formed on a p-type semiconductor layer.

As shown in FIG. 1, the light-emitting element 105 is mounted in a flip-chip manner on the conductive wirings 102 disposed on the surface of the base 101 via the bonding members 103. A surface of the light-emitting element 105 opposed to the surface thereof with the electrodes formed thereon, that is, a main surface of the light transmissive substrate would serve as a light extraction surface. However, in this embodiment, the light reflective film 106 is formed on the light extraction surface, and thus the lateral surface of the light-emitting element 105 practically serves as the light extraction surface. That is, part of the light emitted from the light-emitting element 105 and directed toward the main surface of the light-emitting element 105 is returned to the light-emitting element 105 by the light reflective film 106, then repeatedly reflected inside the light-emitting element 105, and eventually output from the lateral surfaces of the light-emitting element 105. Therefore, the light distribution characteristics of the light-emitting device 100 (see the dotted line in FIG. 4) exhibit the characteristics of a combination of the light passing through the light reflective film 106 and the light emitted from the lateral surfaces of the light-emitting element 105.

The light-emitting element 105 is disposed to straddle the region between the two conductive wirings 102 that are isolated and insulated on positive and negative sides. The light-emitting element 105 is electrically connected and mechanically fixed to the conductive wirings via the conductive bonding members 103. To mount the light-emitting element 105, a method using bumps can be employed as well as a method using solder paste. As a light-emitting element 105, a small-sized package product which includes the light-emitting element encapsulated with a resin or the like can also be used. The shape or structure of the light-emitting element 15 can be appropriately selected.

As will be described below, in the case of the light-emitting device including a wavelength conversion member, the light-emitting element suitably uses a nitride semiconductor ($In_xAl_yGa_{1-x-y}N$, $0 \leq X$, $0 \leq Y$, $X+Y \leq 1$) capable of emitting light with a short wavelength that can efficiently excite a wavelength conversion layer.

Although an embodiment using flip-chip mounting has been described as an example, certain embodiments of the present invention may employ a mounting state in which an insulating base side of a light-emitting element serves as the mounting surface, and electrodes formed on the upper surface of the light-emitting element are connected to wires. In this case, the upper surface of the light-emitting element is an electrode-formed surface side, and the light reflective film is positioned on the electrode-formed surface side.

(Light Reflective Film 106)

The light reflective film 106 is formed on the light extraction surface side, which is the main surface of the light-emitting element 105.

Material for the light reflective film may be one which reflects at least the light emitted from the light-emitting element 105, for example, metal or resin containing a white filler.

A dielectric multilayer film can be used to produce the reflective film with less light absorption. Additionally, the reflectance of the light reflective film can be suitably adjusted by designing the dielectric multilayer film, or its reflectance can also be controlled by adjusting the angle of the light. In particular, the reflectance is increased in the direction perpendicular to the light extraction surface (also called the optical axis direction), and decreased at a large angle relative to the optical axis due to increase of the light transmissivity of the reflective film, which can control the shape of the batwing light distribution.

Figure 3:
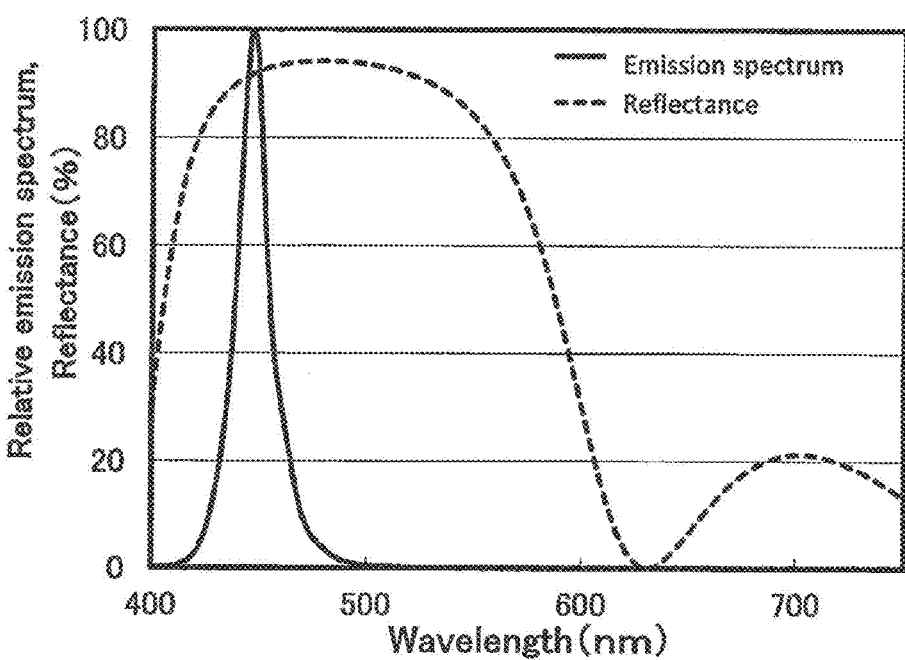
FIG. 3 is a diagram showing a relationship between a wavelength range of a light reflective film and an emission wavelength of a light-emitting element in the light-emitting device of the embodiment.

Regarding a reflection wavelength range in the optical axis direction of the dielectric multilayer film, i.e. in the direction perpendicular to the upper surface of the light-emitting element, as shown in FIG. 3, it is preferable to widen a region on a long wavelength side of the reflection wavelength range, with respect to the emission peak wavelength of the light-emitting element 105.

This is because as the angle from the optical axis is varied, in other words, as the angle from the optical axis of the incident light is increased, the reflection wavelength range of the dielectric multilayer film is shifted to the short wavelength side. By widening the reflection wavelength range toward the long wavelength side with respect to the emission wavelength, the adequate reflectance can be maintained up to a wide angle, that is, for light incident from the light-emitting element at a large angle relative to the optical axis.

Materials suitable for use in the dielectric multilayer film can be a metal oxide film material, a metal nitride film, an oxynitride film, or the like. Organic materials, such as a silicone resin or a fluorine resin, can also be used. However, the material for the dielectric multilayer can be selected from ones other than those described above.

(Encapsulant 108)

Materials suitable for use in the encapsulant 108 can be light transmissive materials, including an epoxy resin, a silicone resin, a mixed resin thereof, or glass. Among them, the silicone resin is preferably selected by taking into consideration the resistance to light and the formability.

The encapsulant 108 can contain: a light diffusion material, a wavelength conversion material, such as phosphors or quantum dots that absorbs part of light from the light-emitting element 105 to output light with a different wavelength from that of the light emitted from the light-emitting element; and a colorant corresponding to the color of emitted light from the light-emitting element.

In the case of adding these materials to the encapsulant 108, it is preferable to use ones less likely to affect the light distribution characteristics. For example, the material having a particle size of 0.2 µm or less is preferable because it less likely to affects the light distribution characteristics. The term "particle size" as used in the present specification means an average particle size, and the average particle size is measured based on a Fisher-SubSieve-Sizers-No. (F.S.S.No) using an air permeability method.

The encapsulant 108 can be formed by compression molding or injection molding to cover the light-emitting element 105. Alternatively, the material for the encapsulant 108 is optimized its viscosity to be dropped or drawn on the light-emitting element 105, thereby controlling the shape of the encapsulant 108 by the surface tension of the material itself.

In the latter formation method, a mold is not required, so that the encapsulant can be formed by a simpler method. Other than adjusting the viscosity of the base material of the encapsulant 108, the viscosity of the encapsulant material can be adjusted by using the above-mentioned light diffusion material, wavelength conversion material, and/or colorant to form the encapsulant 108 with a desired level of viscosity.

Second Embodiment

Figures 7, 8A, 8B:
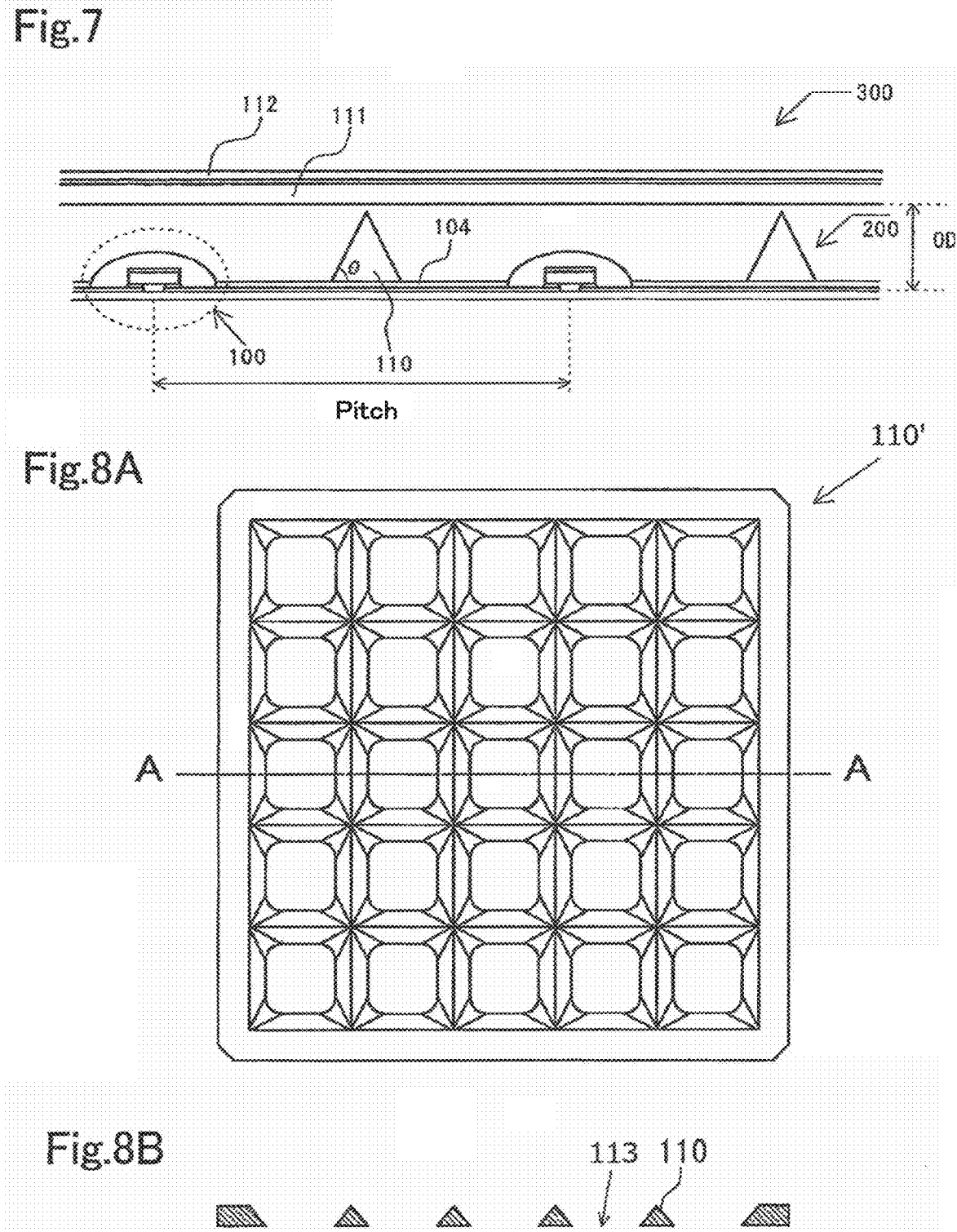
FIG. 7 is a cross-sectional view showing an example of a light-emitting module in a second embodiment.
FIGS. 8A and 8B show an example of a light reflective plate.

FIG. 7 is a cross-sectional view of a light-emitting module 300 including a light-emitting device 200 in a second embodiment. In this embodiment, a plurality of the light-emitting elements 105 is mounted at predetermined intervals on the base 101. At least one light reflective member 110 is disposed between the adjacent light-emitting elements 105 so as to reflect the light emitted at a small angle relative to the upper surface of the light-emitting element (i.e., upper surface of the base 101). That is, the light-emitting device 200 is an integrated light-emitting device that includes a plurality of the light-emitting devices 100 of the first embodiment and the light reflective member 110 disposed between the respective light-emitting devices 100. A light diffusion plate 111 for diffusing the light from the light-emitting element 105 is disposed above the light-emitting devices 100 and the light reflective member 110 and substantially in parallel with the upper surfaces of the light-emitting elements. A wavelength conversion layer 112 for converting part of the light emitted from the light-emitting elements 105 to light with a different wavelength is disposed above the light diffusion plate 111 and substantially in parallel with the light diffusion plate 111.

In general, as the ratio of a distance between the base 101 and the light diffusion plate 111 (hereinafter may be referred to as an optical distance: OD) to a distance between the adjacent light-emitting elements (hereinafter may be referred to as a pitch) is decreased, the amount of light between the light-emitting elements 105 on the surface of the light diffusion plate 111 becomes small, causing a dark space.

However, with the arrangement including the light reflective member 110 disposed in this way, the light reflected by the light reflective member 110 compensates for the amount of light between the light-emitting elements, whereby the non-uniform luminance on the surface of the light diffusion plate 111 can be reduced even in a region with a smaller ratio of OD/Pitch.

Specifically, in the light-emitting device 200 of the second embodiment, an inclination angle θ of a light reflective surface of the light reflective member 110 relative to the base 101 is set such that the non-uniform luminance on the surface of the light diffusion plate 111 is reduced taking into consideration the light distribution characteristics of the respective light-emitting devices 100. Regarding the light distribution characteristics of the plurality of light-emitting devices 100 arranged, each light-emitting device 100 preferably has the light distribution characteristics that the amount of light becomes large in a region with a large light distribution angle, i.e., in a region at a light distribution angle of around +90°, in order to reduce the non-uniform luminance on the surface of the light diffusion plate 111 and to achieve the thinned light-emitting device 200.

When the ratio of OD/Pitch is small, for example, 0.2 or less, an elevation angle at which the incident light enters the light reflective member 110 is less than 22° relative to the light-emitting surface of the light-emitting element 105. Thus, to increase the reflectance of the light by the light reflective member 110 at the low OD/Pitch of 0.2 or less, the light distribution characteristics of the light-emitting device 100 preferably has the feature that, for example, the amount of light at the elevation angle of less than 20° relative to the upper surface of the base is large. Specifically, the first and second peaks of the emission intensity are preferably positioned in a range of the elevation angle of less than 20°. Here, the elevation angle of 20° corresponds to the light distribution angles of 20° and 160° in FIG. 4. In other words, the first peak of emission intensity is positioned in a range of less than 20° of the light distribution angle, and the second peak of emission intensity is positioned in a range of greater than 160° of the light distribution angle, as shown in FIG. 4. The amount of light in a range of the elevation angle of less than 20° is preferably 30% or more of the whole amount of light, and more preferably 40% or more thereof.

(Light Reflective Member 110)

The light reflective member 110 is provided between the adjacent light-emitting elements 105.

The light reflective member may be formed of a material that reflects at least light with the emission wavelength of the light-emitting element 105. For example, a metal plate or resin containing a white filler can be suitably used for the light reflective member.

A dielectric multilayer film can be used as reflective surface of the light reflective member to produce the reflective surface with less light absorption. Additionally, the reflectance of the light reflective member can be appropriately adjusted by designing the dielectric multilayer film, or its reflectance can also be controlled by the angle of the light.

The height of the light reflective member 110 and the inclination angle θ of the light reflective surface relative to the surface of the base 101 can be set to appropriate values. The reflective surface of the light reflective member 110 may be a planar surface or a curved surface. To obtain the desired light distribution characteristics, the suitable inclination angle θ and shape of the reflective surface can be set. The height of the light reflective member 110 is preferably set at 0.3 times or less and more preferably 0.2 times or less the distance between the adjacent light-emitting elements. This arrangement can provide the thinned light-emitting module 300 with less non-uniform luminance.

For the light-emitting device 200 used in an environment where the use temperature tends to change significantly, the linear expansion coefficient of the light reflective member 110 needs to be close to that of the base 101. In the case where the light reflective member 110 significantly differs from the base 101 in the linear expansion coefficient, warpage might occur in the light-emitting device 200 due to the change in temperature, or otherwise the positional relationship between the components, especially, between the light-emitting device 100 and the light reflective member 110 might shift, thus possibly failing to obtain the desired optical properties. However, the linear expansion coefficient is a physical property and thus there are not so many alternatives in reality. For this reason, the light reflective member 110 is preferably formed by a film molded component that is elastically deformable in order to reducing the occurrence of warpage of the light-emitting device 200 even in the case where the light reflective member significantly differs from the base in the linear expansion coefficient. This is because the light reflective member 110 made of a less elastically deformable material, such as solid material tends to expand while maintaining its shape, but the film-shaped light reflective member can be appropriately deformed to compensate its expansion.

Preferably, a plurality of the light reflective members 110 is coupled together into a plate shape to have through holes 113 where the light-emitting devices 200 are disposed. FIG. 8 shows such a plate-shaped light reflective plate 110'. FIG. 8A is a top view of the light reflective plate 110', and FIG. 8B is a cross-sectional view taken along the line A-A of FIG. 8A. Such a light reflective plate 110' can be formed by metal molding, vacuum forming, pressure molding, press forming, and the like. The light reflective plate 110' is disposed on the base 101. The light reflective member 110 may be formed by a method which involves drawing a light reflective resin directly on the base 101, and the like. The height of the light reflective member 110 is preferably set at 0.3 times or less the distance between the adjacent light-emitting elements, and for example, more preferably 0.2 times or less the distance between the adjacent light-emitting elements.

EXAMPLE 1

In this example, as shown in FIG. 1, a glass-epoxy-based material is used for the base 101, and a Cu material of 35 μm in thickness is used as the conductive wiring. A nitride-based blue LED may be used as the light-emitting element 105. The LED has an approximately square shape with one side of 600 μm in length in the planar view and a thickness of 150 μm. An epoxy-based white solder resist may be used as the insulating member 104.

The light reflective film 106 formed on the main surface of the light-emitting element 105 is configured of eleven layers by repeatedly forming a $SiO_2$ layer (82 nm in thickness) and a $Zro_2$ layer (54 nm in thickness).

At this time, the light transmissivity of the light reflective film 106 is shown in FIG. 2. The light transmissivity in the direction perpendicular to the main surface side of the light-emitting element (i.e., in the optical axis direction) is low, and the light transmissivity of the light reflective film is increased as an angle away from the optical axis increases.

The light-emitting element 105 is covered with the encapsulant 108. The encapsulant 108 is formed of a silicone resin and has a height (H) of 1.0 mm and a diameter of the bottom surface (W) of 3.0 mm.

With this arrangement, the light emitted from the light-emitting element 105 is refracted at an interface between the encapsulant 108 and air, which widens the range of the light distribution angles. The light distribution characteristic of the light-emitting device 100 obtained by this arrangement is indicated by the solid line in FIG. 4. The light distribution characteristic obtained by a light-emitting device without the encapsulant 108 is indicated by the dotted line in FIG. 4. In this way, the encapsulant 108 is used together with the light reflective film 106, which can achieve the lower OD/Pitch.

EXAMPLE 2

In Example 2, a plurality of light-emitting elements 105 of Example 1 are mounted on the base 101, and the at least one light reflective member 110 is disposed between the adjacent light-emitting elements. Here, Pitch is set at 12.5 mm.

The light reflective member 110 is a plate-shaped light reflective plate, which is formed using a polypropylene sheet containing a $TiO_2$ filler (having a thickness (t) of 0.2 mm) by the vacuum forming method so as to have a reflection angle θ (i.e., elevation angle) of 55° and a height of 2.4 mm. The light reflective member 110 is a plate-shaped light reflective plate shown in FIG. 8 and disposed on the insulating member 104.

Figure 9A:
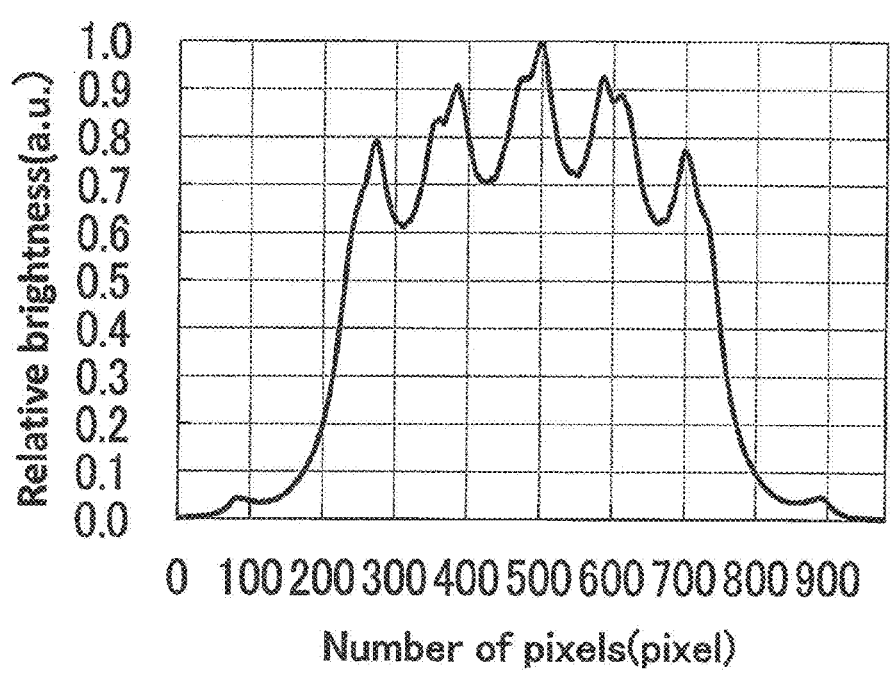
FIGS. 9A and 9B show luminance distribution characteristics of a light-emitting module according to Example 2.
Figure 9B:
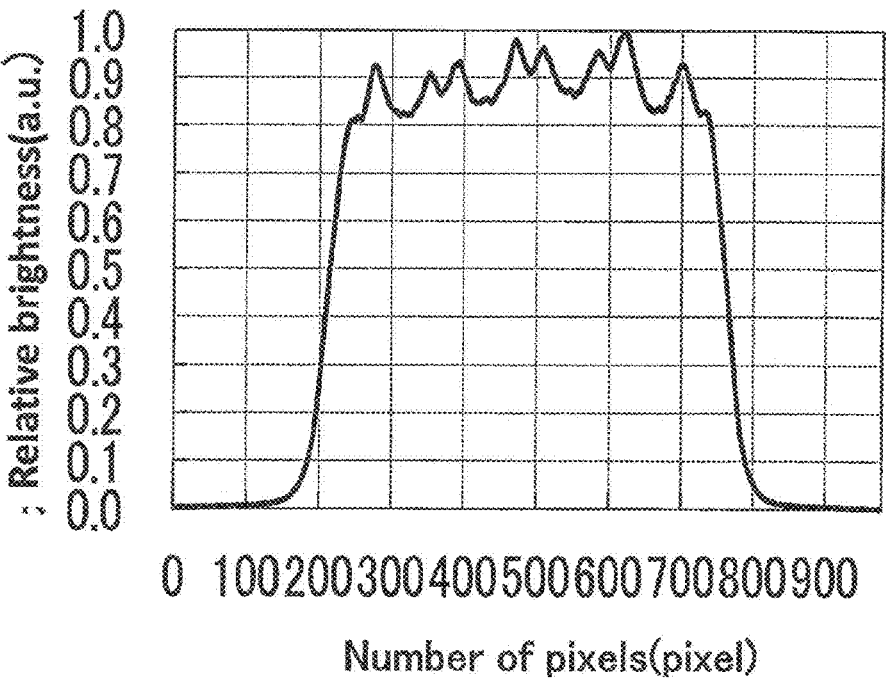

Over the light reflective member 110, a milky-white light diffusion plate 111 and a wavelength conversion layer 112 are disposed to form a liquid crystal backlight (i.e., light-emitting module). In this arrangement, FIGS. 9A and 9B show the result of comparison of the non-uniform luminance on the surface of the light diffusion plate 111 between the presence and absence of the light reflective member 110. FIG. 9A shows a light-emitting module without light reflective member, and FIG. 9B shows a light-emitting module in the presence of the light reflective member. As shown in FIGS. 9A and 9B, in the case where the light reflective member is not disposed, the relative luminance is decreased to in a range of about 0.6 to about 0.7 within a region where the relative luminance tended to be high (i.e., in a range of the number of pixels between about 250 pixels to about 720 pixels). On the other hand, in the case where the light reflective member is disposed, the relative luminance is not decreased to below about 0.8 within the region where the relatively luminance tended to be high (i.e., at the number of pixels between about 250 pixels to about 720 pixels). In other words, it can be seen the effect that non-uniform luminance is improved by providing the light reflective member.

The light-emitting device and light-emitting module of the present embodiments can be used in backlight light sources for liquid crystal displays, various lighting fixtures, and the like.

13

What is claimed is:

1. An integrated light-emitting device comprising:
a base;
a plurality of light-emitting devices mounted on a surface of the base, each of the light-emitting devices comprising:
 a light-emitting element,
 a light reflective film located on an upper surface of the light-emitting element that faces away from the surface of the base, and
 an encapsulant that covers the light-emitting element and the light reflective film so as to directly contact an upper surface of the light reflective film, lateral surfaces of the light reflective film, and lateral surfaces of the light-emitting element, the encapsulant having a dome shape, wherein the encapsulant has a maximum height at a position that overlaps the light-emitting element in a top view; and
a plurality of light reflective members disposed between adjacent ones of the light-emitting devices, wherein the light reflective members divide a surface of the base into a plurality of pixels.

2. The integrated light-emitting device according to claim 1, wherein a ratio (H/W) of a height (H) of each encapsulant to a width (W) of a bottom surface of the encapsulant is 0.5 or less.

3. The integrated light-emitting device according to claim 1, wherein each of the encapsulants contains a light diffusion material.

4. The integrated light-emitting device according to claim 1, wherein a ratio (H/W) of a height (H) of each encapsulant to a width (W) of a bottom surface of the encapsulant is 0.3 or less.

5. A light-emitting module comprising:
the integrated light-emitting device according claim 1; and
a wavelength conversion layer located at a light extraction surface side of the integrated light-emitting device, the wavelength conversion layer being configured to absorb part of light from the light-emitting elements and to convert absorbed light to light with a wavelength different from an emission wavelength of the light-emitting elements.

6. The integrated light-emitting device according to claim 1, wherein each of the light-emitting devices has a batwing light distribution characteristic.

7. The integrated light-emitting device according to claim 1, wherein each of the reflective members has a shape that tapers in a direction away from the surface of the base.

8. A light-emitting module comprising:
a base having an upper surface;

a plate disposed on the upper surface of the base, the plate comprising a plurality of light reflective surfaces that divide the base into a plurality of regions in a top view; and
a plurality of light-emitting devices, each disposed on an upper surface of the base in a respective one of the regions, each light-emitting device comprising:
 a light-emitting element,
 a light reflective film disposed on an upper surface of the light emitting element, and
 an encapsulant that covers the light-emitting element and the light reflective film so as to directly contact an upper surface of the light reflective film, lateral surfaces of the light reflective film, and lateral surfaces of the light-emitting element, the encapsulant having a dome shape, wherein the encapsulant has a maximum height at a position that overlaps the light-emitting element in a top view.

9. The light-emitting module according to claim 8, wherein the plate defines a plurality of openings at which the upper surface of the base is exposed from the light reflective members, and each light-emitting device is disposed in a respective one of the openings.

10. The light-emitting module according to claim 8, wherein each of the regions is rectangular.

11. The light-emitting module according to claim 8, wherein each of the encapsulants contains a light diffusion material.

12. The light-emitting module according to claim 8, wherein a ratio (H/W) of a height (H) of encapsulant to a width (W) of a bottom surface of the encapsulant is 0.5 or less.

13. The light-emitting module according to claim 8, wherein a ratio (H/W) of a height (H) of encapsulant to a width (W) of a bottom surface of the encapsulant is 0.3 or less.

14. The light-emitting module according to claim 8, further comprising:
a wavelength conversion layer located at a light extraction surface side of the plurality of light-emitting devices, the wavelength conversion layer being configured to absorb part of light from the light-emitting elements and to convert absorbed light to light with a wavelength different from an emission wavelength of the light-emitting elements.

15. The light-emitting module according to claim 8, wherein each of the light-emitting devices has a batwing light distribution characteristic.

16. The light-emitting module according to claim 8, wherein each of the reflective members has a shape that tapers in a direction away from the surface of the base.

* * * * *